(12) United States Patent
Saito et al.

(10) Patent No.: US 7,004,035 B2
(45) Date of Patent: Feb. 28, 2006

(54) PHYSICAL VALUE DETECTING APPARATUS AND HOUSING FOR PHYSICAL VALUE DETECTING MEANS

(75) Inventors: Kazunori Saito, Nagano (JP);
Kimihiro Ashino, Nagano (JP);
Katsumichi Ueyanagi, Nagano (JP);
Shigeru Shinoda, Nagano (JP)

(73) Assignee: Fuji Electric Device Technology Co., Ltd., Tokyo (JP)

( * ) Notice: Subject to any disclaimer, the term of this patent is extended or adjusted under 35 U.S.C. 154(b) by 0 days.

(21) Appl. No.: 10/854,232

(22) Filed: May 27, 2004

(65) Prior Publication Data

US 2005/0016289 A1 Jan. 27, 2005

(30) Foreign Application Priority Data

Jun. 6, 2003 (JP) ............................. 2003-161853

(51) Int. Cl.
*G01L 21/12* (2006.01)
(52) U.S. Cl. ....................................... 73/756
(58) Field of Classification Search .................. 73/146, 73/756, 754
See application file for complete search history.

(56) References Cited

U.S. PATENT DOCUMENTS

| 4,686,764 | A | * | 8/1987 | Adams et al. ............... 29/592.1 |
| 6,055,865 | A | * | 5/2000 | Ichihashi ...................... 73/754 |
| 6,260,417 | B1 | * | 7/2001 | Watanabe et al. ............. 73/754 |
| 6,330,829 | B1 | * | 12/2001 | Kurtz et al. .................. 73/717 |
| 6,401,545 | B1 | * | 6/2002 | Monk et al. .................. 73/756 |
| 6,550,337 | B1 | * | 4/2003 | Wagner et al. ................ 73/715 |
| 6,591,689 | B1 | * | 7/2003 | Nidan et al. .................. 73/754 |
| 6,604,430 | B1 | * | 8/2003 | Saito et al. ................... 73/756 |
| 6,612,180 | B1 | * | 9/2003 | Kurtz ........................... 73/754 |
| 2002/0029639 | A1 | * | 3/2002 | Wagner et al. ................ 73/756 |

* cited by examiner

*Primary Examiner*—David M. Gray
*Assistant Examiner*—George P Bonanto
(74) *Attorney, Agent, or Firm*—Manabu Kanesaka

(57) ABSTRACT

A physical value detecting apparatus includes a housing having a concave portion; a physical value detecting device housed in the concave portion and having a substantially rectangular shape for converting a physical value into an electric signal and outputting the electric signal; a device for taking out a signal from the physical value detecting device; an adhesive member for adhering the physical value detecting device to the concave portion; and a positioning device provided on an inner wall of the concave portion for positioning the physical value detecting device. The concave portion supports the physical value detecting device at a bottom thereof via the adhesive member without contacting corner parts of the physical value detecting device.

13 Claims, 11 Drawing Sheets

PHYSICAL VALUE DETECTING APPARATUS AND HOUSING FOR PHYSICAL VALUE DETECTING MEANS

BACKGROUND OF THE INVENTION AND RELATED ART STATEMENT

The present invention relates to a physical value detecting apparatus using a housing in which a semiconductor device is housed, and a housing in which a semiconductor sensor device is housed for converting pressure and acceleration into electric signals and outputting the electric signals.

A semiconductor pressure sensor chip having a piezo resistance effect is generally used in a pressure detecting apparatus for measuring an engine intake pressure of an automobile. The principle of the semiconductor pressure sensor is well known. The semiconductor pressure sensor is constructed such that a bridge circuit of a plurality of semiconductor distortion gauges is formed on a diaphragm made of a material having a piezo resistance effect (such as single-crystal silicon). An electric signal is obtained from a change in gauge resistance of the semiconductor distortion gauges of the bridge circuit according to deformation of the diaphragm.

FIG. 10 is a view showing such a pressure detecting apparatus, and FIG. 11 is a sectional view taken along line 11-11 in FIG. 10. A pressure detecting apparatus 100 is constructed such that a sensor device 1 comprised of a base 11 made of glass, silicon, or the like, and a semiconductor pressure sensor chip 12 provided with a diaphragm 13 mounted on the base 11 is mounted in a concave portion 3 of a resin housing 2 formed of an injection molded thermosetting resin such as epoxy resin or a thermoplastic resin such as PPS (polyphenylene sulfide). Conventionally, an adhesive is disposed in the concave portion 3 of the resin housing 2, and the base 11 of the sensor device 1 is die-bonded with the adhesive. Then, lead terminals (lead frames) 5 for lead-out passing through the resin housing 2 and integrated with the resin housing 2 with an insertion molding are electrically connected to the semiconductor pressure sensor chip 12 with bonding wires 6.

The semiconductor pressure sensor chip 12 is joined to the base 11 so as to reduce stress applied from the resin housing 2. Further, a gel protective member 7 is used as a protective member for protecting a surface of the semiconductor pressure sensor chip 12 and the bonding wires 6 from contaminants included in a medium whose pressure is measured and for transmitting measured pressure to the semiconductor pressure sensor chip 12.

Further, a resin cap 8 formed of a material same as that of the resin housing 2 with the injection molding and having a pressure lead-in pipe 81 connected to a space to be measured is attached to the resin housing 2 to form a pressure detecting chamber 9. Pressure of the medium to be measured guided through the pressure lead-in pipe 81 is led into the pressure detecting chamber 9, and a change in the pressure in the pressure detecting chamber 9 is detected as a signal output from the sensor device 1 (refer to Japanese Patent Publication (Kokai) No. 2002-310836).

FIGS. 12 to 15 are enlarged views showing the concave portion 3 formed in the resin housing 2 in which the sensor device 1 of the pressure detecting apparatus 100 shown in FIG. 10 is housed. FIG. 12 is a plan view thereof, FIG. 13(a) is a sectional view taken along line 13(a)—13(a) in FIG. 12, and FIG. 13(b) is a sectional view taken along line 13(b)—13(b) in FIG. 12. For the sake of explanation, the bonding wires 6 are shown in FIG. 12 and FIG. 13(a). FIG. 14 is an enlarged view of a circled area in FIG. 13(b).

In the pressure detecting apparatus 100 described above, the concave portion 3 is formed to have an opening with an optimum dimension relative to the sensor device 1 so that the sensor device 1 can operate accurately and reliably, and also be made small. When the opening of the concave portion 3 is too small, the resin housing 2 may be deformed due to external stress from the resin cap 81 or thermal stress caused by an environmental temperature, thereby affecting and changing characteristics of the sensor device 1.

In particular, when positioning parts 31 protruding from the resin housing 2 at locations corresponding to corner parts 14 of the sensor device 1 are provided for preventing the sensor device 1 from being displaced in a direction θ, the corner parts 14 are located close to the positioning parts 31 and may contact with the positioning parts 31. Further, the positioning parts 31 and the corner parts 14 shown in FIGS. 12 and 13 make it difficult to insert the sensor device 1 into the concave portion 3 when the sensor device 1 is adhered to the concave portion 3.

Further, if a large amount of adhesive 4 is used for adhering the sensor device 1 to the resin housing 2, the adhesive 4 overflowing from a bottom of the sensor device 1 enters a space between the sensor device 1 and the base 11, so that a climbing part 41 is formed in the space between the sensor device 1 and the base 11. In this case, the deformation of the resin housing 2 is likely to affect and change the characteristics of the sensor device.

FIG. 15 is a sectional view similar to FIG. 13(b). As shown in FIG. 15, the bottom of the concave portion 3 of the resin housing 2 may have a saucer-shape with the injection molding due to a surface sink 42. When the bottom has such a variation in height, the resin housing 2 may contact the bottom of the sensor device at the corner parts 14, so that the deformation of the resin housing 2 affects and changes the characteristics of the sensor device. When the variation becomes greater than 10 $\mu$m, this problem is especially prominent. The problems described above are common in an apparatus such as an acceleration detecting apparatus as well as the pressure detecting apparatus, in which a physical value is converted into an electric signal.

In view of the problems described above, an object of the present invention is to provide a physical value detecting apparatus, in which a physical value is converted into an electric signal to be output. The physical value detecting apparatus is less susceptible to external stress or stress caused by deformation of a housing.

Further objects and advantages of the invention will be apparent from the following description of the invention.

SUMMARY OF THE INVENTION

To attain the objects described above, according to the present invention, a physical value detecting apparatus includes a housing having a concave portion; physical value detecting means housed in the concave portion and having a substantially rectangular shape for converting a physical value into an electric signal and outputting the electric signal; means for taking out a signal from the physical value detecting means; adhesive means for adhering the physical value detecting means to the concave portion; and positioning means provided on an inner wall of the concave portion for positioning the physical value detecting means. The concave portion supports the physical value detecting means at a bottom thereof via the adhesive means without contacting eight corner parts of the physical value detecting means.

According to the present invention, a physical value detecting apparatus includes a housing having a concave portion; physical value detecting means housed in the concave portion and having a substantially rectangular shape for converting a physical value into an electric signal and outputting the electric signal; means for taking out a signal from the physical value detecting means; adhesive means for adhering the physical value detecting means to the concave portion; positioning means provided on an inner wall of the concave portion for positioning the physical value detecting means; relief parts provided on the concave portion at locations facing corner parts of the physical value detecting means so that a distance between the positioning means and the physical value detecting means is smaller than a distance between the concave portion and the corner parts of the physical value detecting means; and concaved parts formed at bottoms of the relief parts and having bottoms lower than a bottom of the concave.

According to the present invention, a physical value detecting apparatus includes a housing having a concave portion; physical value detecting means housed in the concave portion and having a substantially rectangular shape for converting a physical value into an electric signal and outputting the electric signal; means for taking out a signal from the physical value detecting means; adhesive means for adhering the physical value detecting means to the concave portion; positioning means provided on an inner wall of the concave portion for positioning the physical value detecting means; and relief parts provided on the concave portion at locations facing corner parts of the physical value detecting means so that a distance between the positioning means and the physical value detecting means is smaller than a distance between the concave portion and the corner parts of the physical value detecting means.

In the present invention, the positioning means are preferably formed on two inner walls between the relief parts at locations adjacent to the relief parts. The positioning means are preferably formed of two inner walls adjacent to the relief parts. The relief parts are preferably formed in a circular arc shape. The positioning means is preferably integrated with the housing. The physical value detecting means preferably comprises a semiconductor type sensor using a piezo resistance effect.

According to the present invention, a housing of a physical value detecting apparatus includes a concave portion for housing physical value detecting means with a substantially rectangular shape in which a physical value is converted into an electric signal and the electric signal is output; positioning means provided on an inner wall of the concave portion; relief parts provided in the concave portion at locations facing corners of the physical value detecting means and at a distance from the physical value detecting means longer than a distance between the positioning means and the physical value detecting means when the physical value detecting means is housed; and concaved parts formed at bottoms of the relief parts and having bottoms lower than a bottom of the concave.

In the present invention, the relief parts and the concaved parts are provided at four corners of the concave portion, and the positioning parts are provided for allowing the sensor device to displace during wire bonding. Accordingly, it is possible to provide the physical value detecting means with required initial characteristics and reliability in which the sensor device is less susceptible to stress from the resin housing.

Further, since the concaved parts are provided, the bottoms of the corner parts of the sensor device do not contact or are not close to the resin housing even if a surface sink is formed at the bottom of the concave portion of the resin housing, thereby reducing the effects of the resin housing on the characteristics of the sensor device. Further, since an excess amount of the adhesive stays at areas provided in the depth direction of the resin housing, the adhesive overflowing from the bottom of the sensor chip does not enter a space between the resin housing and the sensor device, thereby reducing the effects of deformation of the resin housing on the characteristics of the sensor chip while a sufficient contact area between the resin housing and the sensor chip is ensured.

As a result, it is possible to provide physical value detecting apparatuses with required initial characteristics and reliability in a large quantity with a uniform shape.

BRIEF DESCRIPTION OF THE DRAWINGS

FIGS. 2(a) and 2(b) are sectional views of the pressure detecting apparatus shown in FIG. 1, in which FIG. 2(a) is a sectional view taken along line 2(a)—2(a) in FIG. 1, and FIG. 2(b) is a sectional view taken along line 2(b)—2(b) in FIG. 1;

FIGS. 5(a) and 5(b) are sectional views of the pressure detecting apparatus according to a third embodiment of the present invention, in which FIG. 5(a) is a sectional view similar to FIG. 2(a), and FIG. 5(b) is a sectional view similar to FIG. 2(b);

FIGS. 9(a) and 9(b) are charts showing variations in an output voltage of a pressure detecting apparatus, wherein FIG. 9(a) is a chart of the pressure detecting apparatus according to the first embodiment of the present invention, FIG. 9(b) is a chart of a conventional pressure detecting apparatus;

FIGS. 13(a) and 13(b) are sectional views of the conventional pressure detecting apparatus shown in FIG. 12, in which FIG. 13(a) is a sectional view taken along line 13(a)—13(a) in FIG. 12, and FIG. 13(b) is a sectional view taken along line 13(b)—13(b) in FIG. 12;

DETAILED DESCRIPTION OF PREFERRED EMBODIMENTS

Hereunder, embodiments of the present invention will be described in detail with reference to the accompanying drawings. In the following description, the present invention is applied to a pressure detecting apparatus. However, the present invention is not limited to the pressure detecting apparatus, and may be applied to other physical value detecting apparatuses in which a physical value is converted into an electric signal to be output.

Figure 1:
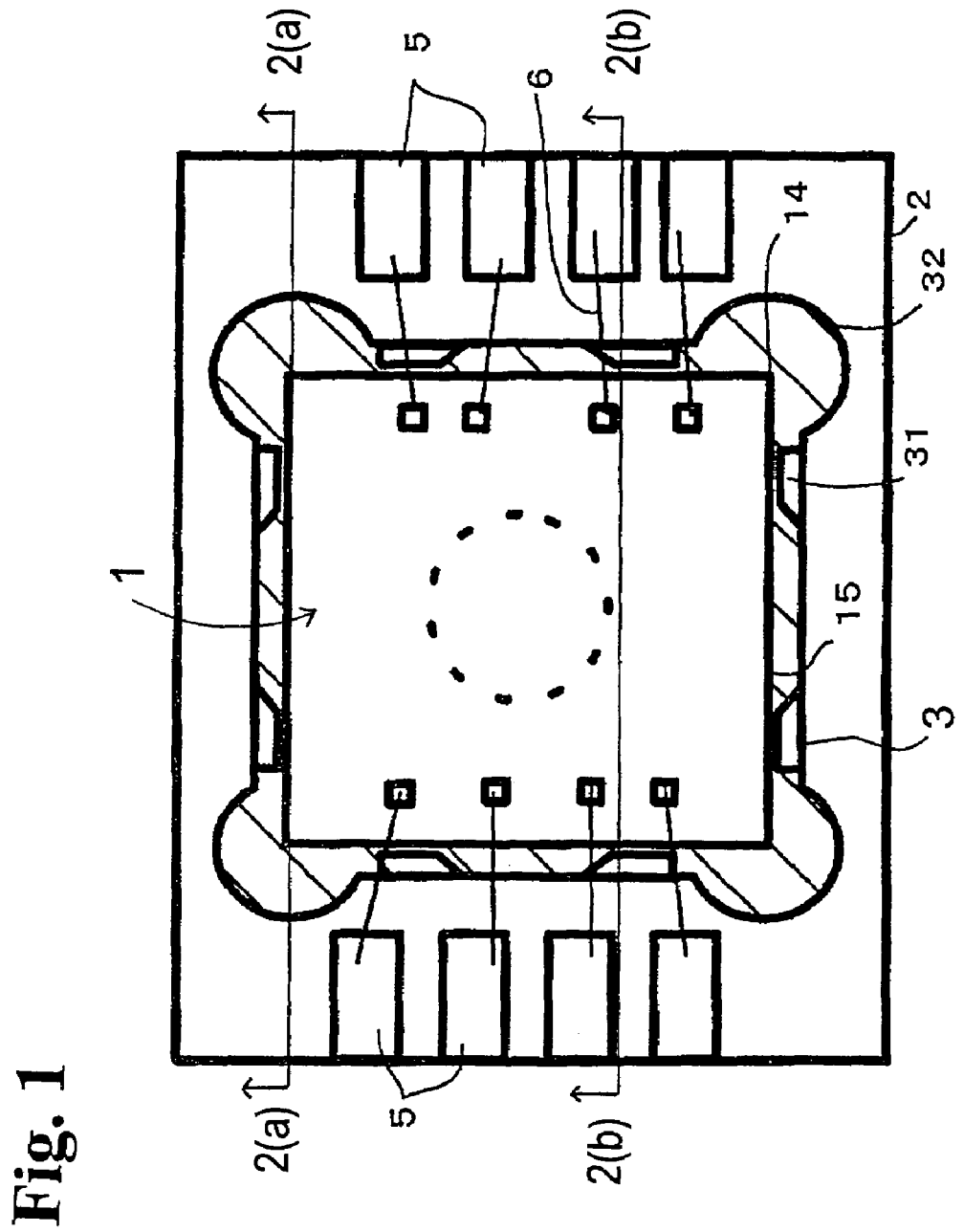
FIG. 1 is a plan view showing an essential part of a pressure detecting apparatus according to a first embodiment of the present invention.
Figure 2A:
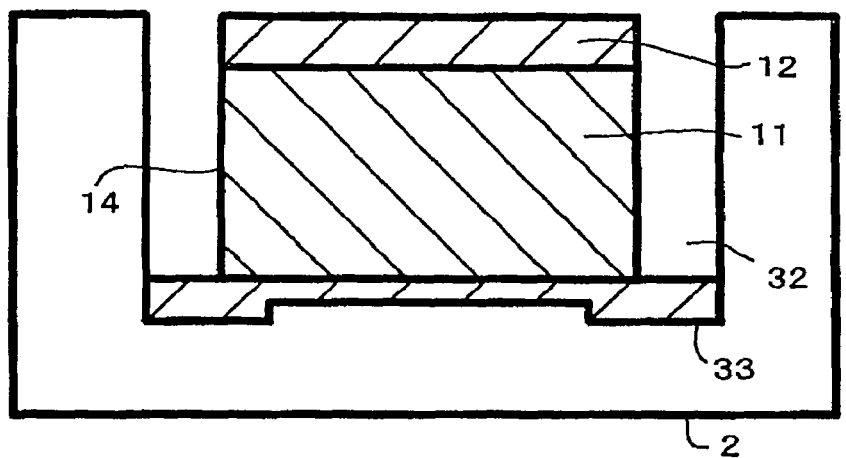
Figure 2B:
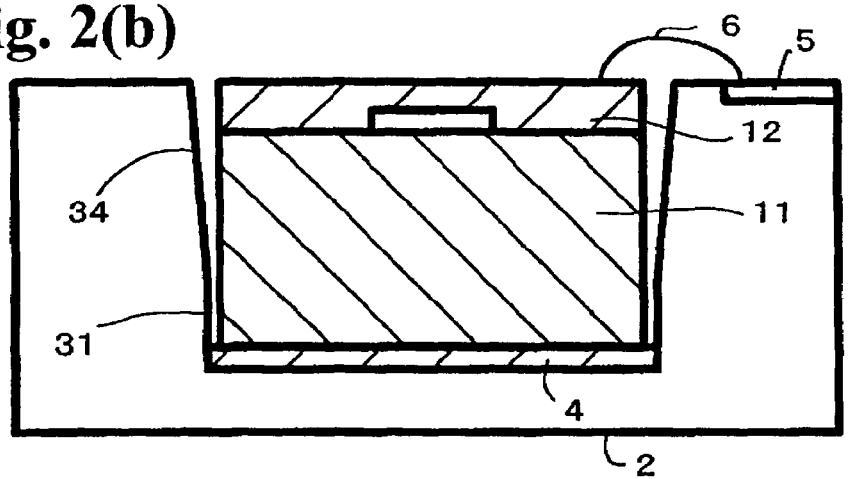
Figure 3:
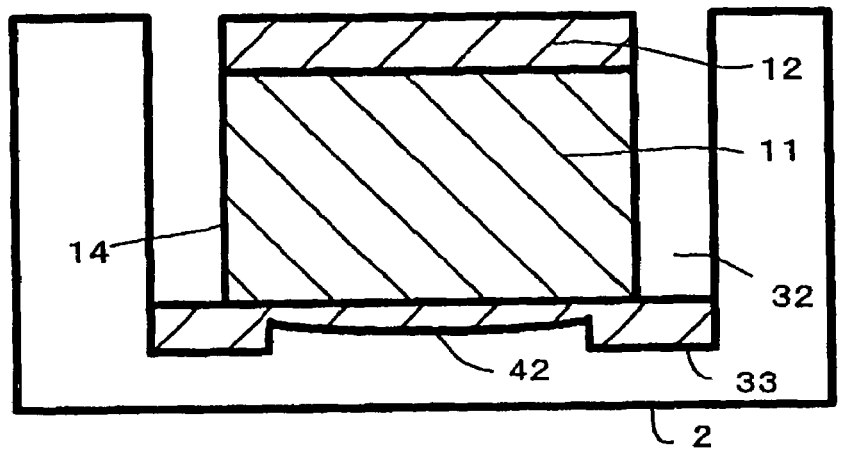
FIG. 3 is a sectional view similar to FIG. 2(a)

A first embodiment of the present invention will be described with reference to FIGS. 1 to 3. FIG. 1 is a plan view showing essential parts of a pressure detecting apparatus according to the first embodiment of the invention. FIG. 2(a) is a sectional view taken along line 2(a)—2(a) in FIG. 1, and FIG. 2(b) is a sectional view taken along line 2(b)—2(b) in FIG. 1. For the convenience of explanation, bonding wires 6 are shown in FIGS. 1 and 2(b). FIG. 3 is a sectional view similar to FIG. 2(a).

Figure 10:
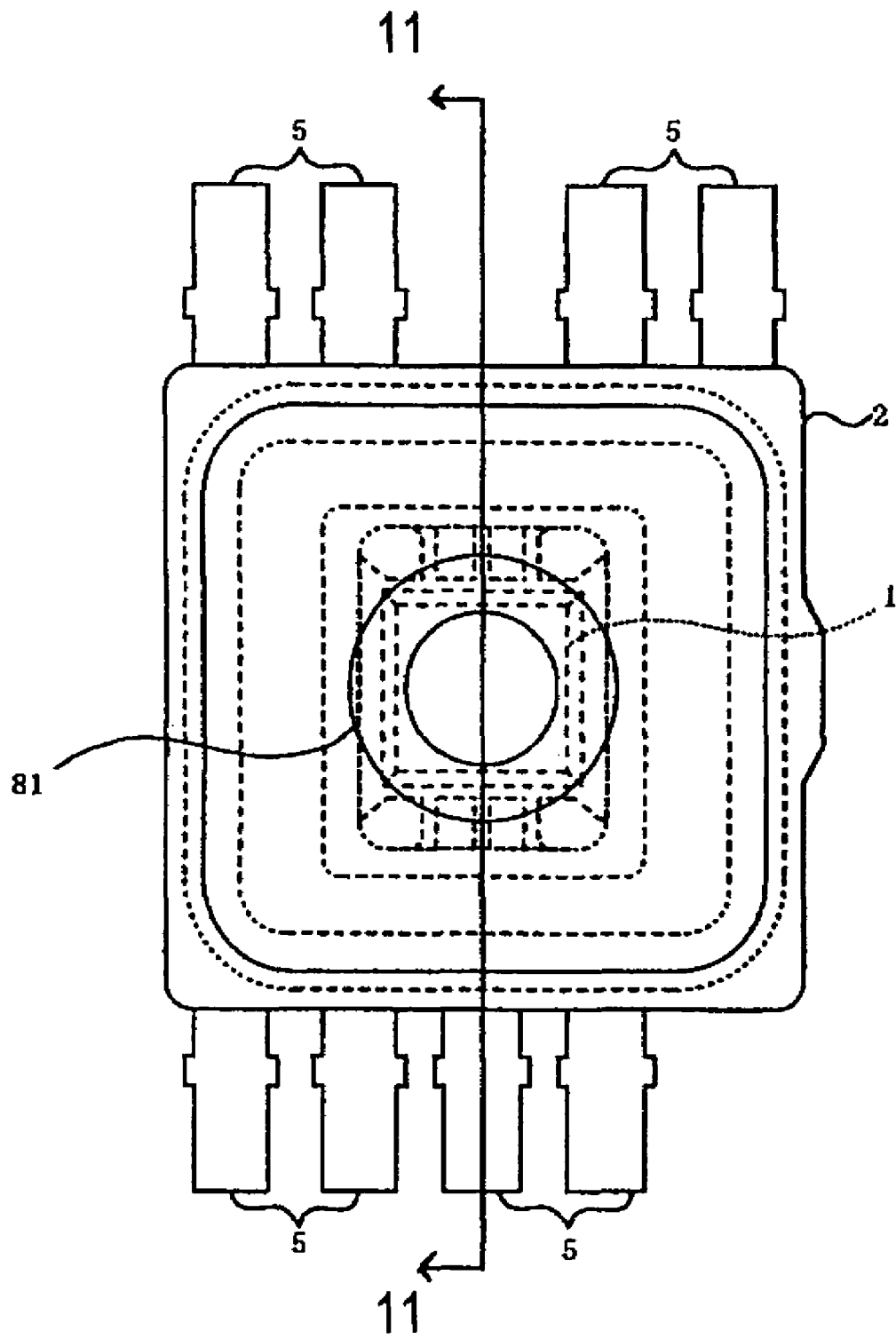
FIG. 10 is a plan view showing a conventional pressure detecting apparatus.
Figure 11:
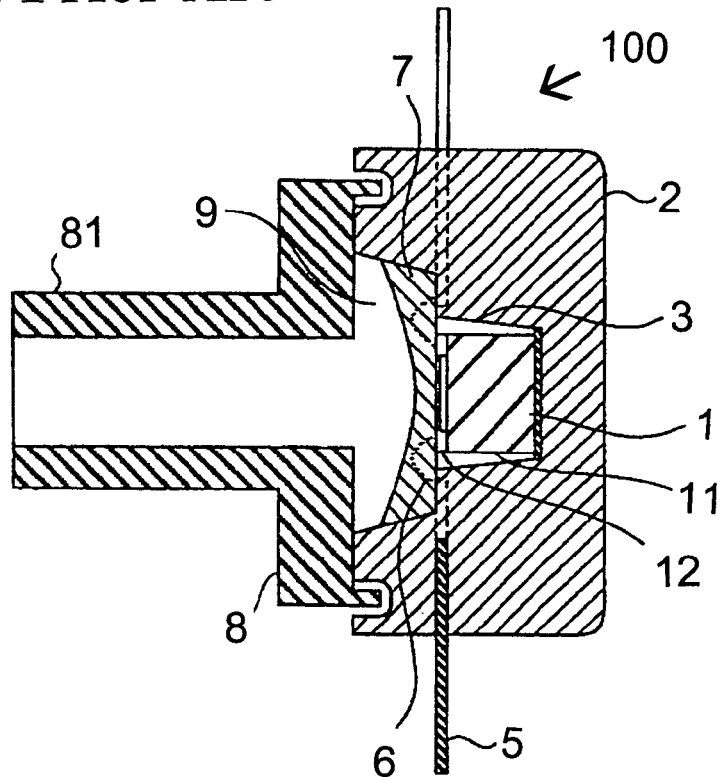
FIG. 11 is a sectional view taken along line 11—11 in FIG. 10.
Figure 12:
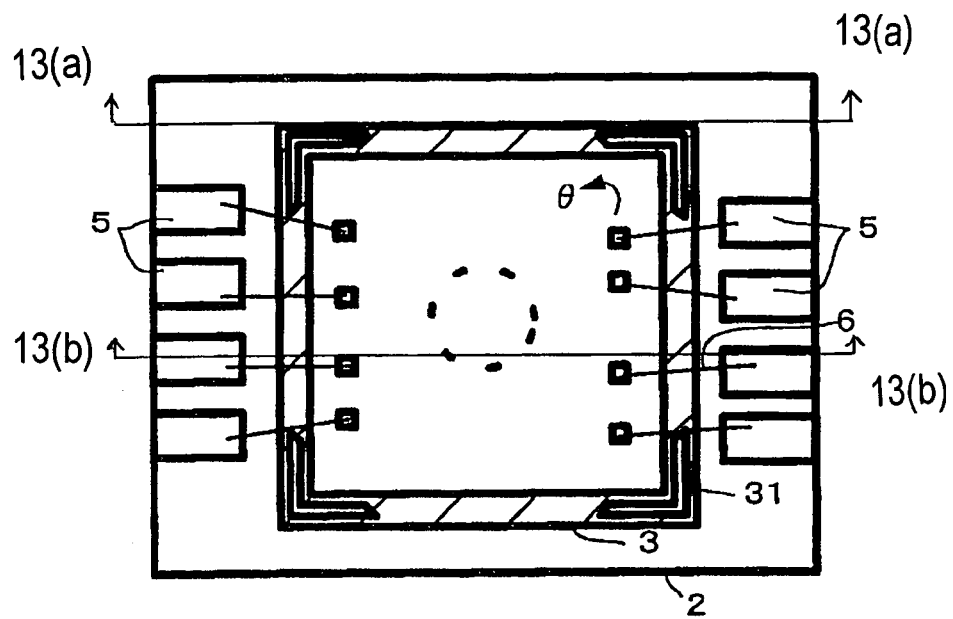
FIG. 12 is a plan view showing an essential part of a conventional pressure detecting apparatus.
Figure 13A:
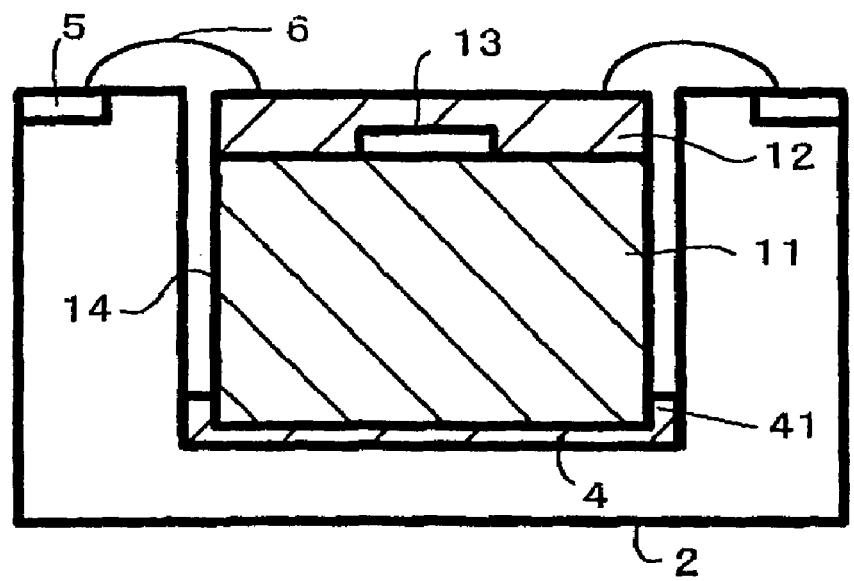
Figure 13B:
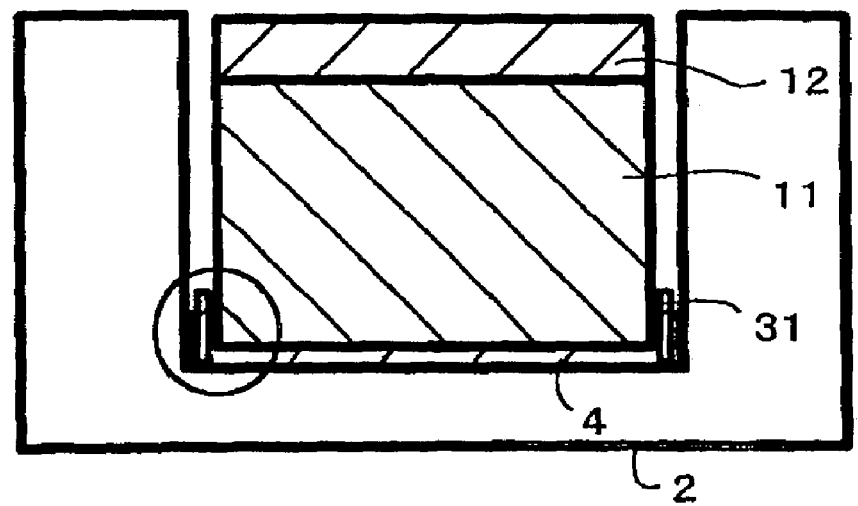
Figure 14:
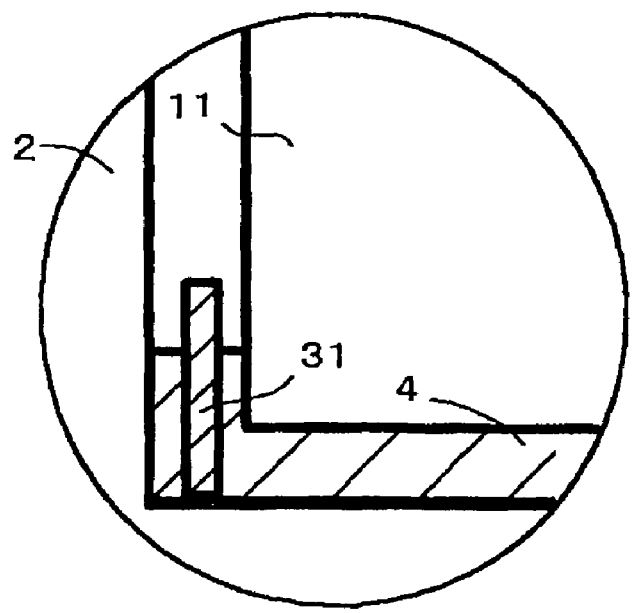
FIG. 14 is an enlarged view of a circled area shown in FIG. 13(b)
Figure 15:
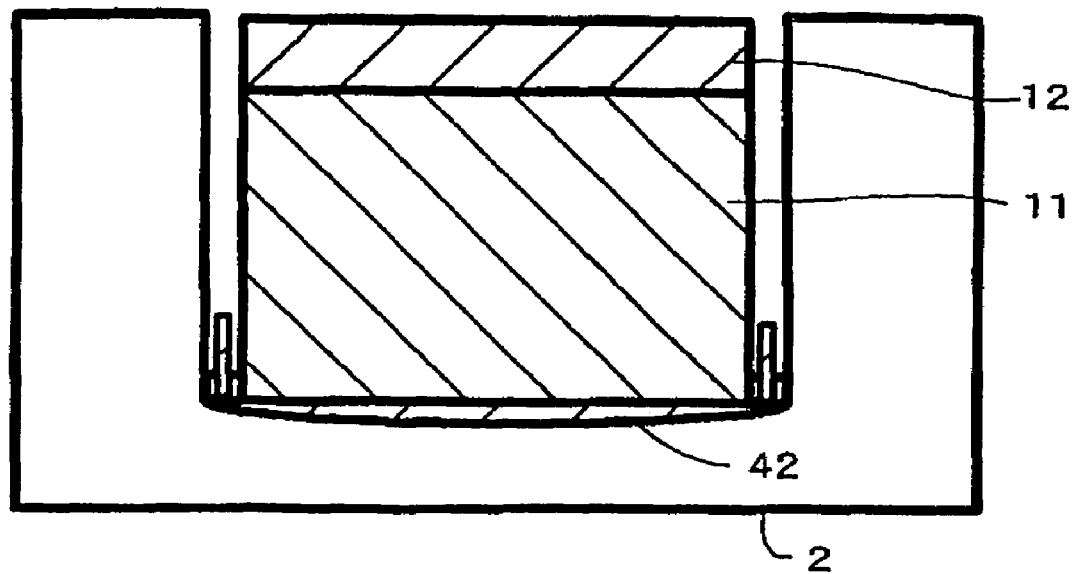
FIG. 15 is a sectional view similar to FIG. 13(a).

FIG. 1 is a plan view mainly showing a concave portion 3 of a pressure detecting apparatus 100 below lead terminals 5 and bonding wires 6 similar to the conventional apparatus shown in FIG. 10. The pressure detecting apparatus 100 is different from the conventional pressure detecting apparatus 100 shown in FIG. 12 in that relief parts 32 are provided at four corners of the concave portion 3 corresponding to corner parts 14 of a sensor device 1. Further, concaved parts 33 are provided in a bottom of the resin housing 2 at bottoms of the relief parts 32. Accordingly, positioning parts 31 are located in the vicinity of the relief parts 32. The sensor device 1 is attached to the bottom of the concave portion 3 using an adhesive with a function of reducing stress from the resin housing 2 to the sensor device 1. The adhesive typically has Young's modulus of about 2 to 50 kgf/cm$^2$, and includes, for example, silicon rubber adhesive.

The relief parts 32 are formed such that a distance between the corner parts 14 of the sensor device 1 and the concave portion 3 is longer than a shortest distance between side parts 15 of the sensor device 1 and the concave portion 3. It is preferred that the shortest distance between the side parts 15 and the concave portion 3 is 0.0 to 0.4 mm so as to inhibit displacement of the sensor device 1. The distance between the corner parts 14 and the concave portion 3 is only required to be longer than the shortest distance between the side parts 15 of the sensor device 1 and the concave portion 3. It is preferred that the distance between the corner parts 14 of the sensor device 1 and the concave portion 3 is made as long as possible to reduce stress as far as the resin housing 2 has a necessary strength and dimension. Further, it is preferred that the relief parts 32 are formed in an arc shape about the respective corner parts 14 when the sensor device 1 is disposed at a desired location, so that the distance between the corner parts 14 and the concave portion 3 is uniformed and stress is reduced uniformly.

It is preferred that each of the concaved parts 33 formed at the bottoms of the relief parts 32 has a depth of about 0.05 to 0.2 mm. When the concaved parts 33 have a depth less than 0.05 mm, it is difficult to prevent the adhesive from climbing due to a variation in an amount of the adhesive. When the concaved parts 33 have a depth greater than 0.2 mm, the resin housing 2 may lose stiffness. A molding die of the resin housing 2 may include the relief parts 32, so that the relief parts 32 can be formed when the resin housing 2 is formed. With the relief parts 32, it is possible to provide a space between the resin housing 2 and the corner parts 14 of the sensor device 1, i.e. a portion most susceptible to stress from the resin housing 2, thereby stabilizing characteristics of the sensor device 1.

The positioning parts 31 are made of a material same as that of the resin housing 2, and a molding die of the resin housing 2 includes the positioning parts 31, so that the positioning parts 31 are formed when the resin housing 2 is formed. Further, the concave portion 3 may have a slope 34 inclined toward an opening edge of the concave portion 3, so that the sensor device 1 is easily housed in the concave portion 3.

As shown in FIG. 3, the concaved parts 33 are formed in the bottom of the resin housing 2 at the bottoms of the relief parts 32. Accordingly, even if a dimension is changed due to a resin surface sink 42 at the bottom of the concave portion 3 after the resin housing 2 is molded, it is possible to prevent the bottoms of the corner parts 14 of the sensor device 1 from becoming close to the resin housing 2, thereby reducing an effect of deformation of the resin housing 2 on the characteristics of the sensor device 1.

When the sensor device 1 is attached to the resin housing 2 using the adhesive 4, even if an excessive amount of the adhesive 4 is applied, due to the concaved parts 33 in the concave portion 3, the adhesive 4 overflowing from the bottom of the sensor device 1 does not enter a space between the resin housing 2 and the base 11 of the sensor device 1, thereby reducing the effect of the deformation of the resin housing 2 on the characteristics of the sensor device 1. Further, the concaved parts 33 can also reduce external stress and stress caused by deformation of the resin housing 2, thereby reducing a change in the characteristics of the sensor device 1.

Figure 4:
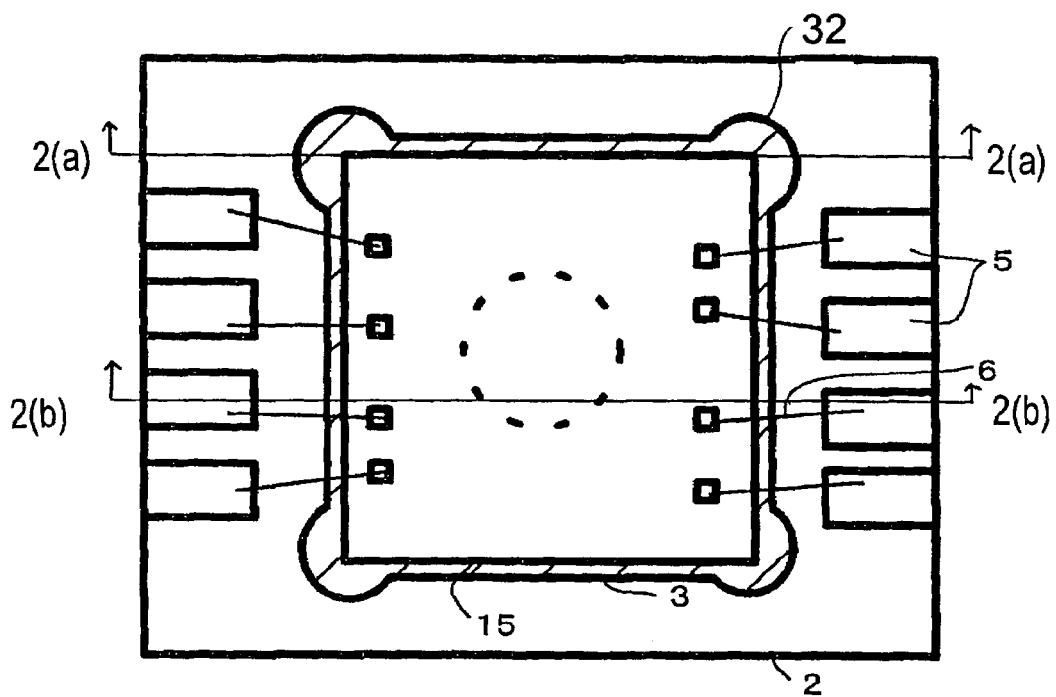
FIG. 4 is a plan view showing an essential part of a pressure detecting apparatus according to a second embodiment of the present invention.

A second embodiment of the present invention will be described with reference to FIG. 4. FIG. 4 is a plan view showing an essential part of a pressure detecting apparatus according to the second embodiment, and showing parts same as those shown in the plan view in FIG. 1.

As shown in FIG. 4, the relief parts 32 are provided at four corners of the concave portion 3 corresponding to the corner parts 14 of the sensor device 1 as shown in FIG. 1. A sectional view taken along line 2(a)—2(a) in FIG. 4 and a sectional view taken along line 2(b)—2(b) in FIG. 4 are the same as the sectional views in FIGS. 2(a) and 2(b), respectively. Further, the side parts 15 of the concave portion 3 serve as positioning parts in the sensor device 1. It is preferred that the distance between the side parts 15 of the concave portion 3 and the sensor device 1 is 0.0 to 0.4 mm as in the first embodiment. In the present embodiment, the same effects as in the first embodiment can be obtained.

Figure 5A:
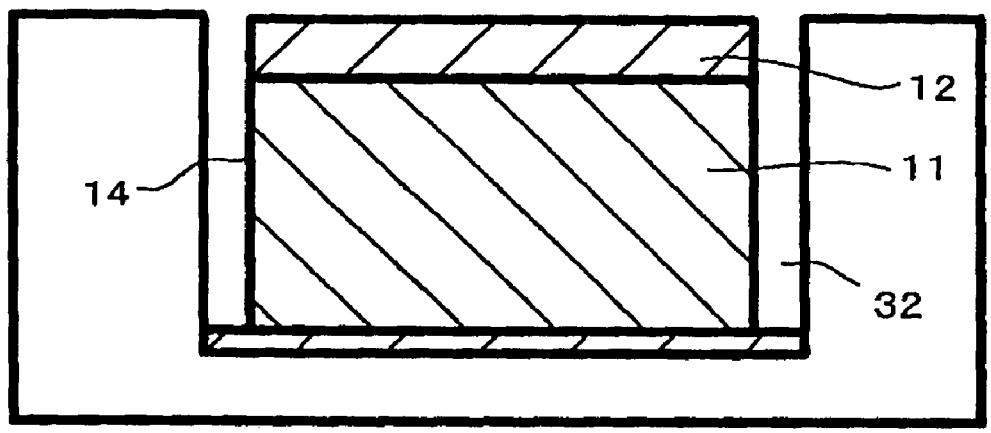
Figure 5B:
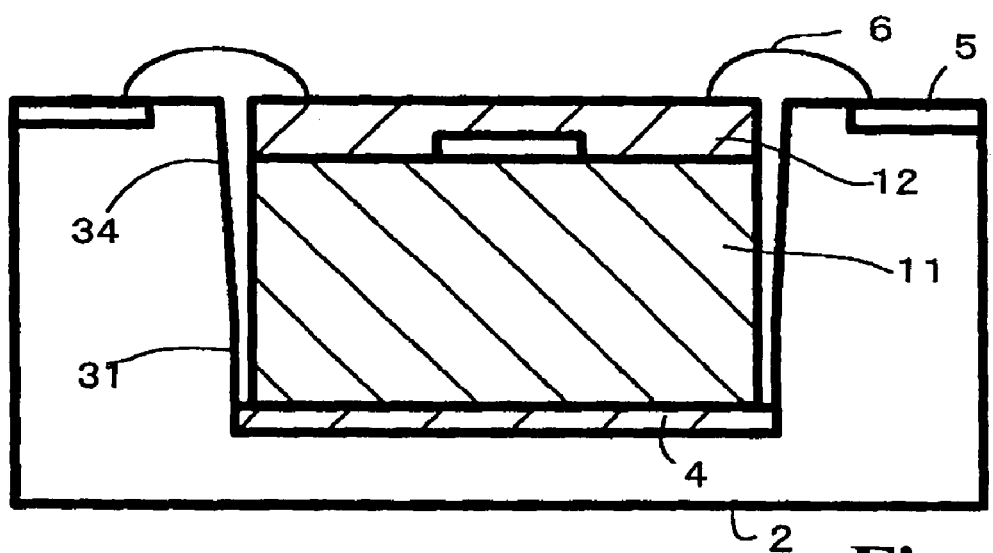

A third embodiment of the present invention will be described with reference to FIGS. 5(a) and 5(b). FIG. 5(a) is a sectional view same as that taken along line 2(a)—2(a) in FIG. 1, and FIG. 5(b) is a sectional view same as that taken along 2(b)—2(b) in FIG. 1. The third embodiment is different from the first embodiment in that the concaved parts 33 are not provided. In the third embodiment, the relief parts 32 are provided at four corners of the concave portion 3 corresponding to the corner parts 14 of the sensor device 1, as in the first embodiment. As in the first embodiment, there is a sufficient space between the resin housing 2 and the corner parts 14 of the sensor device 1, i.e. the portion most susceptible to the stress from the resin housing 2, thereby stabilizing the characteristics of the sensor device 1.

Figure 6:
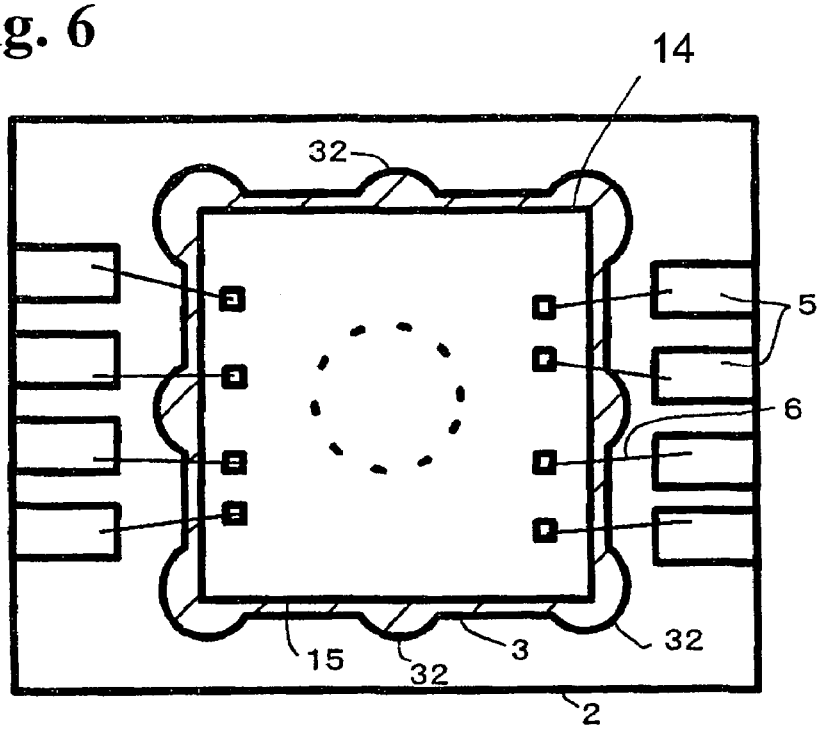
FIG. 6 is a plan view showing an essential part of a pressure detecting apparatus according to a fourth embodiment of the present invention.

A fourth embodiment of the present invention will be described with reference to FIG. 6. FIG. 6 is a plan view showing an essential part of a pressure detecting apparatus according to the fourth embodiment. The fourth embodiment is different from the first embodiment in that a plurality of relief parts 32 is provided at the side parts 15 of the concave portion 3. With the plurality of relief parts 32 formed in the concave portion 3, there is a sufficient space between the resin housing 2 and the corner parts 14 and the side parts 15 at four sides of the sensor device 1, i.e. the portion most susceptible to the stress from the resin housing 2, thereby stabilizing the characteristics of the sensor device 1. The plurality of relief parts 32 may be provided at the side part 15 on one side of the concave portion 3.

Figure 7:
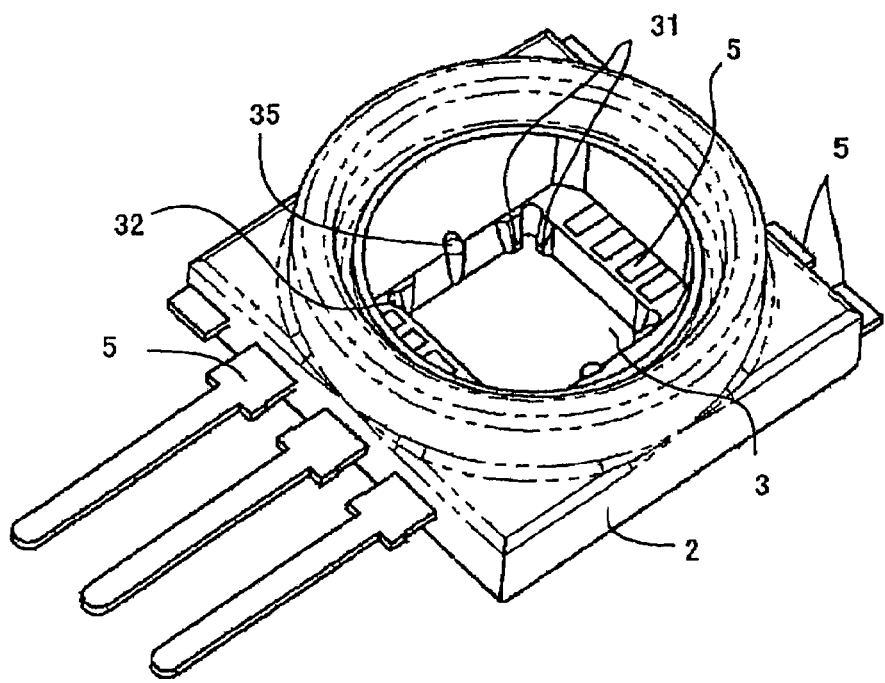
FIG. 7 is a perspective view showing an essential part of a pressure detecting apparatus according to a fifth embodiment of the present invention.

A fifth embodiment of the present invention will be described with reference to FIG. 7. FIG. 7 is a perspective view showing an essential part of a pressure detecting apparatus according to the fifth embodiment. The lead terminals 5 are molded in the resin housing 2 with insertion molding, and the positioning parts 31 are provided for positioning the sensor device 1 (not shown) and have the relief parts 32 at both sides thereof. The concaved parts 33

(not shown) are also provided. Reorganization surfaces 35 are formed for recognizing a height of the lead terminals 5 or the like during wire bonding.

In the embodiments described above, the relief parts 32 are formed in an arc shape, and the present invention is not limited to the arc shape. Further, the sensor device 1 is constructed such that the semiconductor pressure sensor chip 12 is connected to the base 11, and the effects of the present invention can be obtained even if the sensor device 1 is comprised only of the semiconductor pressure sensor chip 12.

The resin housing for the sensor device is made of a thermosetting resin such as epoxy resin, or a thermoplastic resin such as PPS (polyphenylene sulfide), thereby making it possible to produce the resin housing in a large scale by transfer molding or injection molding.

As an example 1, the pressure detecting apparatus shown in FIG. 1 was fabricated. The sensor device 1 was constructed such that the base 11 made of glass was joined to the semiconductor sensor chip 12 using anode junction technique, and had a rectangular shape with a side of 4.1 mm. A distance between the opposed positioning parts 31 was 4.25 mm. The relief parts 32 were formed such that the distance from the corner parts 14 was 0.22 mm when the sensor device 1 was disposed at a desired location. The concaved parts 33 had a depth of 0.11 mm from the bottom of the concave portion 3. Silicon adhesive with Young's modulus of 3.9 kgf/cm$^2$ was used as the adhesive 4.

In the pressure detecting apparatus fabricated as above, the corner parts 14 did not contact the concave portion 3 even if the distance between the positioning parts 31 and the sensor device 1 was 0.0 mm. As a comparative example, a pressure detecting apparatus was formed with a structure same as that of the pressure detecting apparatus according to the first embodiment except that the relief parts 32 were not provided.

Figure 8:
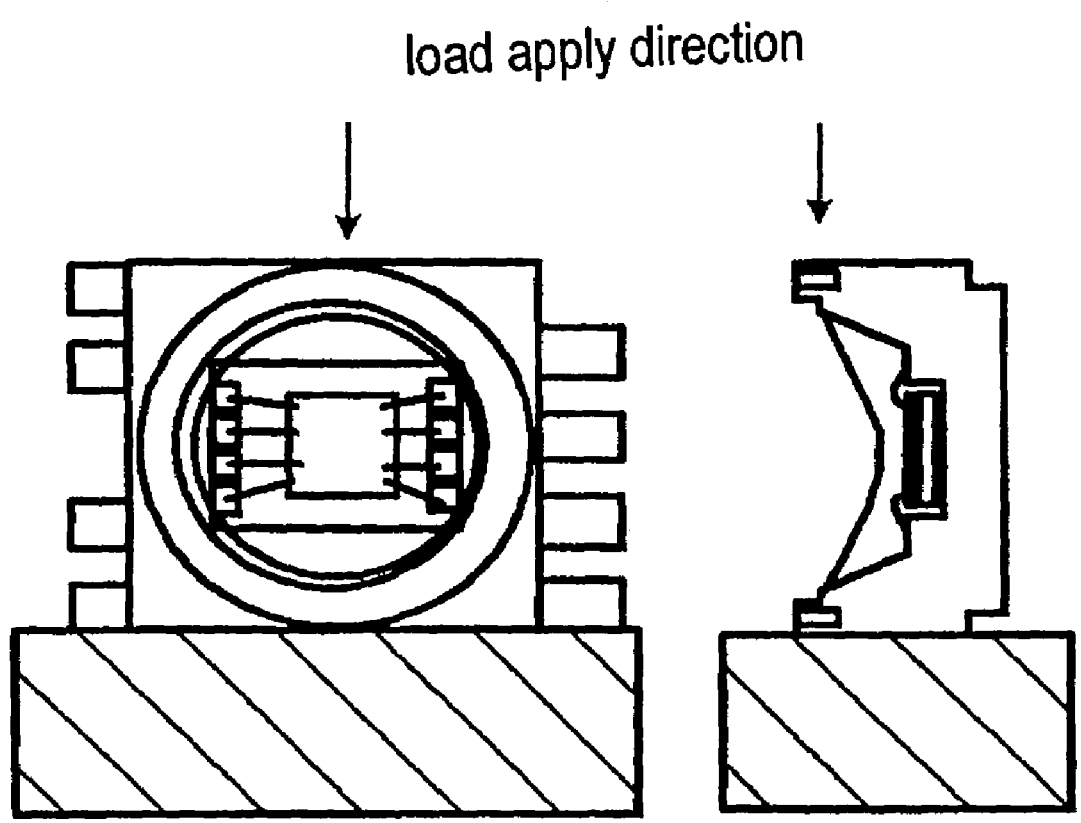
FIG. 8 is a view showing a direction in which load is applied.
Figure 9A:
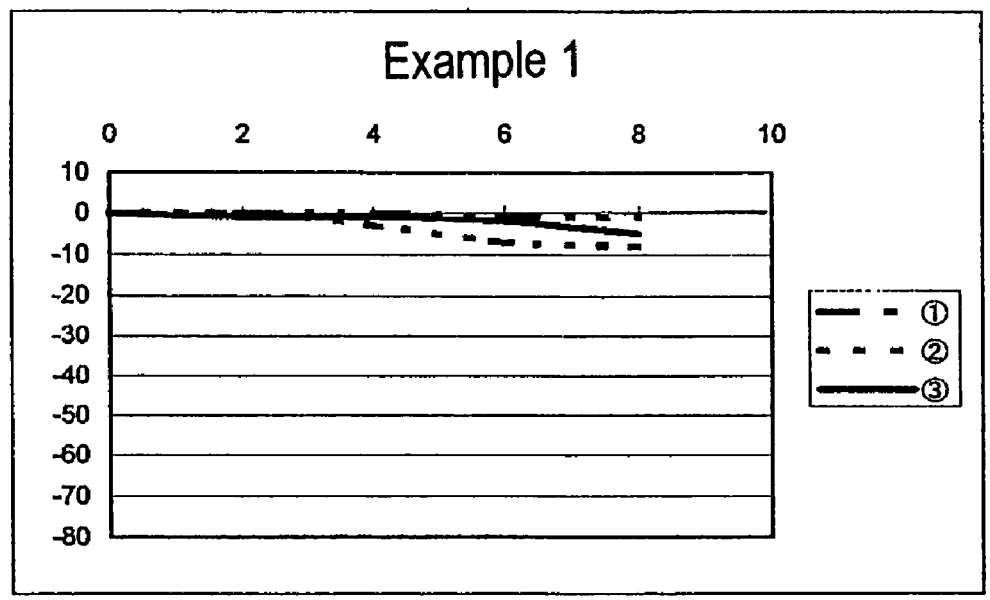
Figure 9B:
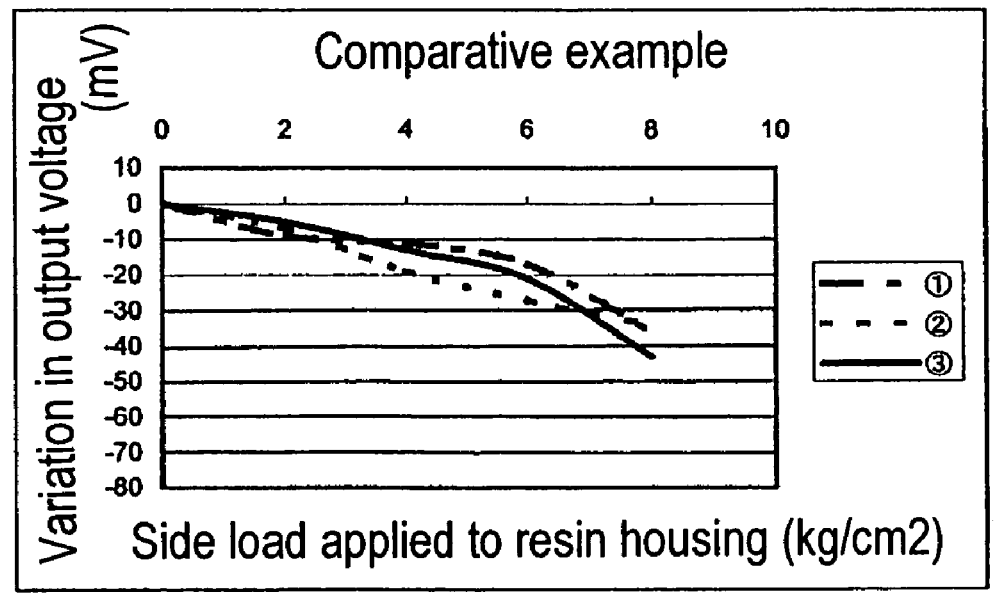

FIG. 8 is a view showing a direction in which load was applied to the examples. FIGS. 9($a$) and 9($b$) are charts showing variations in an output voltage from the pressure detecting apparatus when the side load was applied to the pressure detecting apparatus. The results were based on experiments conducted on three pressure detecting apparatuses of the example 1 and three pressure detecting apparatuses of the comparative examples. In the pressure detecting apparatuses of the example 1, it was found that the sensor output was almost unchanged up to 8 kg/cm$^2$.

According to the present invention, it is possible to reduce the effect of the stress from the resin housing on the sensor chip when the sensor chip is properly positioned. As a result, the pressure detecting apparatus with required initial characteristics and reliability can be provided.

While the invention has been explained with reference to the specific embodiments of the invention, the explanation is illustrative and the invention is limited only by the appended claims.

What is claimed is:

1. A physical value detecting apparatus comprising:
   a housing having a concave portion, inner walls and a bottom portion,
   physical value detecting means housed in the concave portion and having a substantially rectangular shape for converting a physical value into an electric signal and for outputting the electric signal,
   means for taking out the electrical signal from the physical value detecting means,
   adhesive means for adhering the physical value detecting means to the concave portion so that the physical value detecting means is supported on the bottom portion via the adhesive means,
   positioning means formed on the inner walls of the housing for positioning the physical value detecting means in the concave portion, and
   first relief parts formed in the inner walls of the housing at portions facing corners of the physical value detecting means, each first relief part being located so that a distance between the first relief part and the physical value detecting means is greater than a distance between the positioning means and the physical value detecting means in a level parallel to the bottom portion.

2. A physical value detecting apparatus according to claim 1, further comprising concaved parts formed at bottoms of the first relief parts and under the corners of the physical value detecting means, each of said bottoms being lower than the bottom portion of the housing.

3. A physical value detecting apparatus according to claim 1, wherein said positioning means is disposed at least on two inner walls adjacent to one of the first relief parts.

4. A physical value detecting apparatus according to claim 1, wherein said positioning means is formed by two inner walls adjacent to the first relief parts.

5. A physical value detecting apparatus according to claim 1, wherein said first relief parts are formed in an arc shape.

6. A physical value detecting apparatus according to claim 1, wherein said positioning means is integrally formed with the housing.

7. A physical value detecting apparatus according to claim 1, wherein said physical value detecting means is a semiconductor sensor using a piezo resistance effect.

8. A physical value detecting apparatus according to claim 1, further comprising a second relief part formed in the inner wall of the housing between the first relief parts.

9. A housing for housing physical value detecting means having a substantially rectangular shape, comprising:
   a concave portion for housing the physical value detecting means, having inner walls and a bottom portion,
   positioning means formed on the inner walls of the concave portion,
   relief parts formed in the inner walls of the concave portion at locations facing corners of the physical value detecting means, each of the relief parts being located so that a distance between the relief part and the physical value detecting means is greater than a distance between the positioning means and the physical value detecting means in a level parallel to the bottom portion when the physical value detecting means is housed, and
   concaved parts formed at bottoms of the relief parts and portions under the corners of the physical value detecting means, each of said concaved parts having a bottom lower than the bottom portion of the concave portion.

10. A physical value detecting apparatus according to claim 1, wherein said positioning means is a projection partly projecting from the inner wall of the housing.

11. A physical value detecting apparatus according to claim 1, wherein each of said first relief parts has an arc shape so that an edge of the corner is substantially located in a center of the arc shape.

12. A physical value detecting apparatus according to claim 9, wherein said positioning means is a projection partly projecting from the inner wall of the housing.

13. A physical value detecting apparatus according to claim 9, wherein each of said relief parts has an arc shape so that an edge of the corner is substantially located in a center of the arc shape.

* * * * *